US007923747B2

(12) United States Patent
Wang et al.

(10) Patent No.: US 7,923,747 B2
(45) Date of Patent: Apr. 12, 2011

(54) WAFER LEVEL LED PACKAGE STRUCTURE AND METHOD FOR MAKING THE SAME

(75) Inventors: Bily Wang, Hsinchu (TW); Sung-Yi Hsiao, Gongguan Shiang (TW); Jack Chen, Toufen Township, Miaoli County (TW)

(73) Assignee: Harvatek Corporation, Hsinchu (TW)

( * ) Notice: Subject to any disclaimer, the term of this patent is extended or adjusted under 35 U.S.C. 154(b) by 18 days.

(21) Appl. No.: 12/346,329

(22) Filed: Dec. 30, 2008

(65) Prior Publication Data
US 2010/0032706 A1    Feb. 11, 2010

(30) Foreign Application Priority Data

Aug. 6, 2008    (TW) ................ 97129856 A

(51) Int. Cl.
*H01L 33/00*    (2010.01)
(52) U.S. Cl. .......................... 257/99; 257/98
(58) Field of Classification Search ............. 257/98–100
See application file for complete search history.

(56) References Cited

U.S. PATENT DOCUMENTS

| 6,110,823 | A  | * | 8/2000  | Eldridge et al. | ............ 438/660 |
| 6,185,238 | B1 | * | 2/2001  | Onomura et al. | ......... 372/46.01 |
| 6,655,810 | B2 | * | 12/2003 | Hayashi et al. | ............... 362/600 |
| 6,977,396 | B2 | * | 12/2005 | Shen et al. | ................ 257/100 |
| 2003/0010986 | A1 | * | 1/2003 | Lin et al. | ....................... 257/79 |

* cited by examiner

*Primary Examiner* — Wai-Sing Louie
*Assistant Examiner* — Bilkis Jahan
(74) *Attorney, Agent, or Firm* — Kile Goekjian Reed & McManus PLLC

(57) ABSTRACT

A wafer level LED package structure includes a light-emitting unit, a first conductive unit, a second conductive unit and an insulative unit. The light-emitting unit has a light-emitting body, a positive conductive layer and a negative conductive layer formed on the light-emitting body, and a first insulative layer formed between the positive conductive layer and the negative conductive layer. The first conductive unit has a first positive conductive layer formed on the positive conductive layer and a first negative conductive layer formed on the negative conductive layer. The second conductive unit has a second positive conductive layer formed on the first positive conductive layer and a second negative conductive layer formed on the first negative conductive layer. The insulative unit has a second insulative layer formed on the first insulative layer and disposed between the second positive conductive layer and the second negative conductive layer.

8 Claims, 14 Drawing Sheets

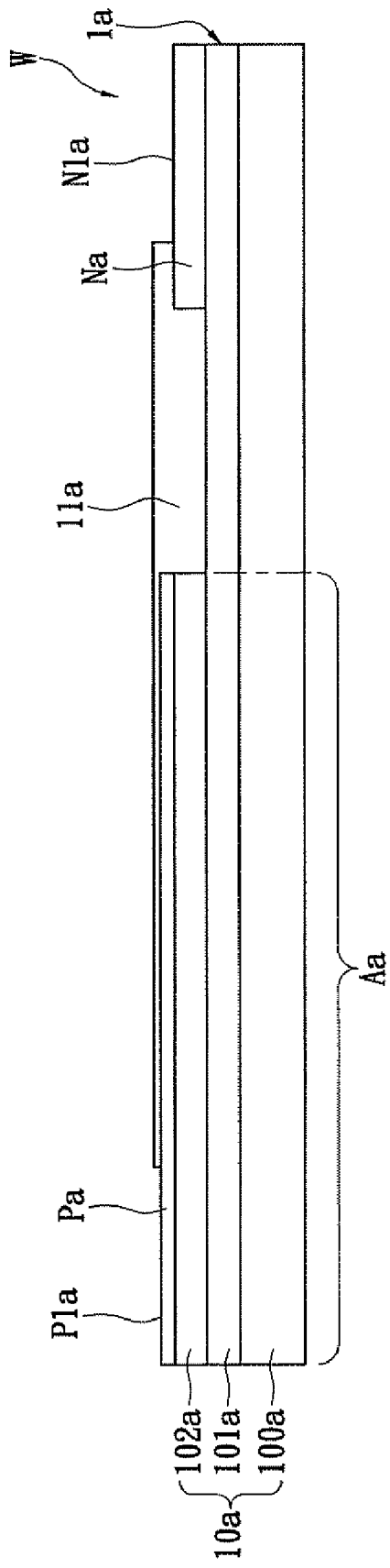
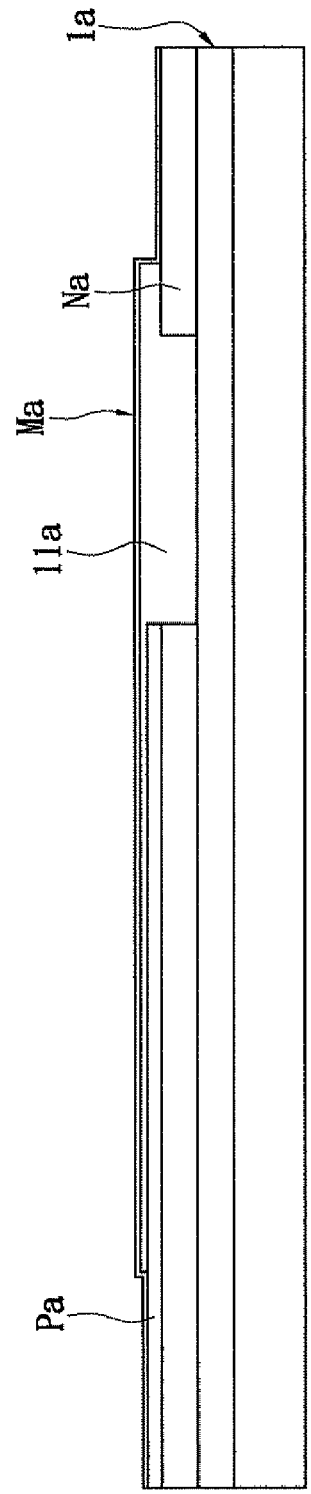
FIG. 2A
FIG. 2B

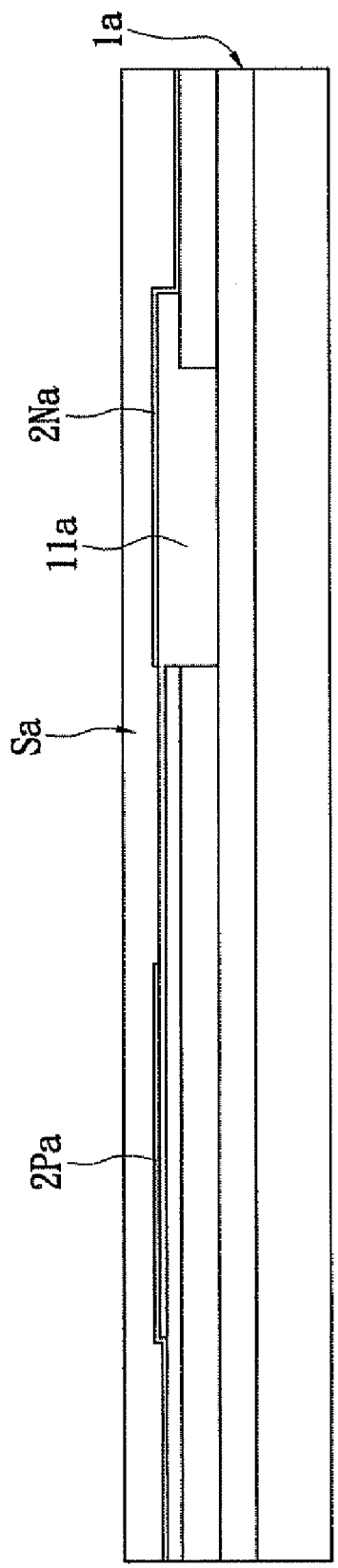
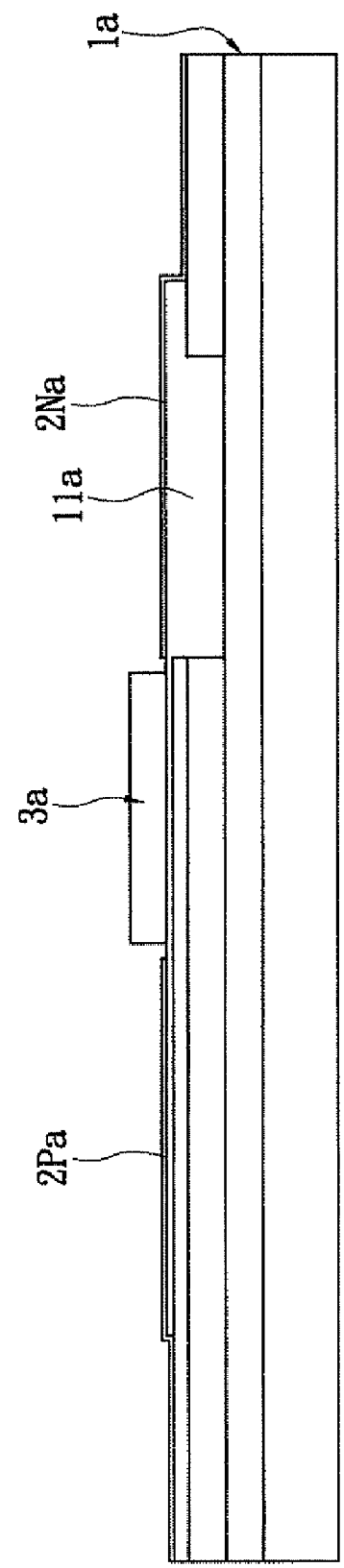

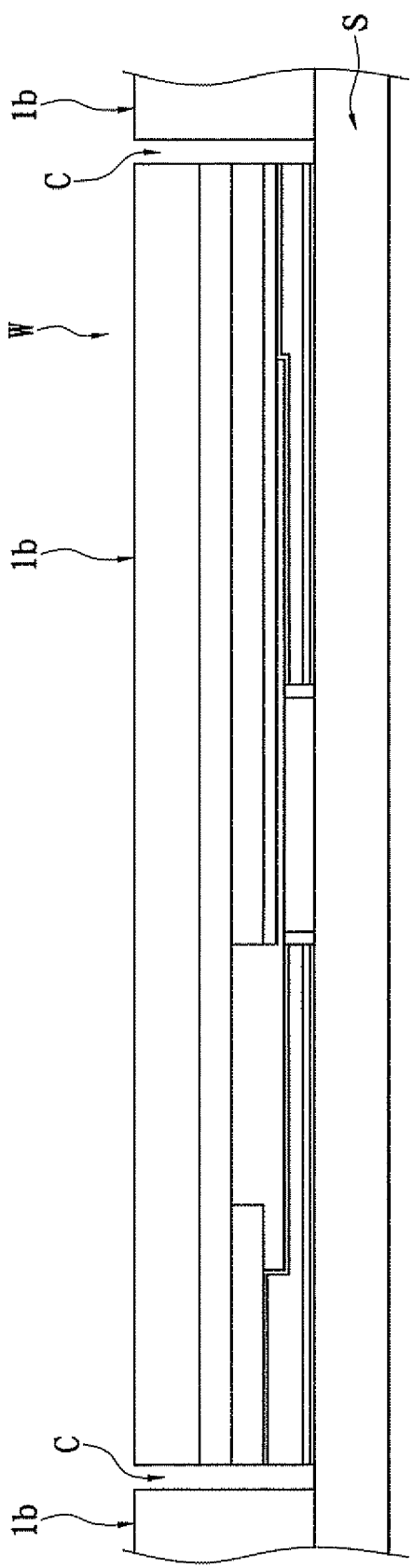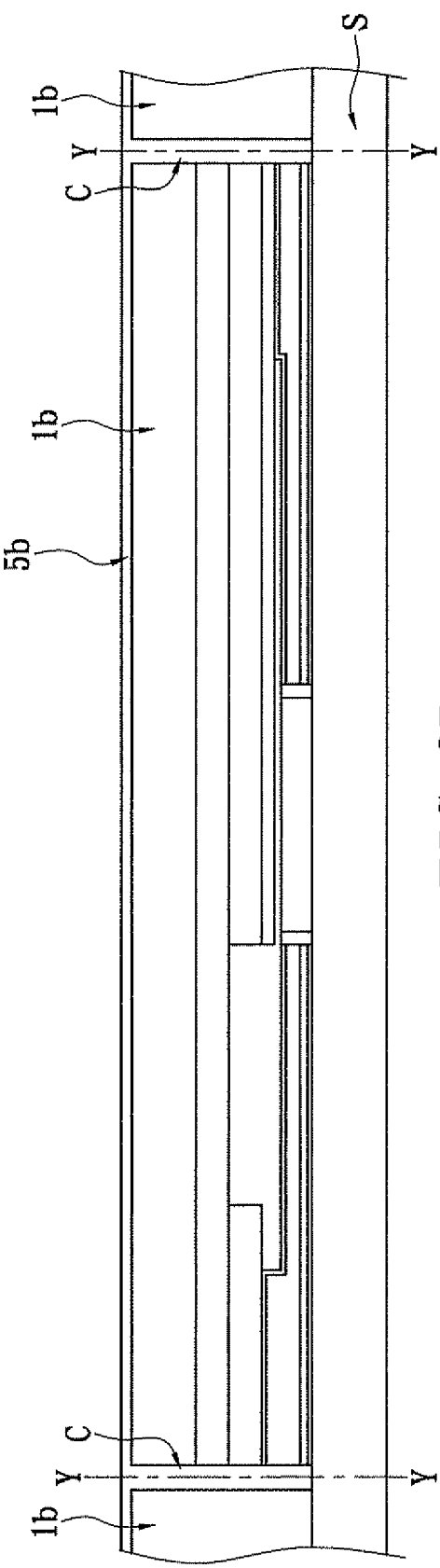

US 7,923,747 B2

WAFER LEVEL LED PACKAGE STRUCTURE AND METHOD FOR MAKING THE SAME

CROSS-REFERENCE TO RELATED APPLICATION

This application claims priority under 35 U.S.C. §119 to Taiwan Patent Application No. 097129856, filed on Aug. 06, 2008, in the Taiwan Intellectual Property Office, the entire contents of which are hereby incorporated by reference.

BACKGROUND OF THE INVENTION

1. Field of the Invention

The present invention relates to a wafer level LED package structure and a method for making the same, and particularly relates to a wafer level LED package structure for increasing conductive area and heat-dissipating area and a method for making the same.

2. Description of Related Art

Referring to FIG. 1, the prior art provides an LED (Light Emitting Diode) package structure including: a light-emitting body 1, a positive conductive layer P and a negative conductive layer N formed on the light-emitting body 1, a reflecting layer 2 formed on a bottom side of the light-emitting body 1 and a transparent package body 3 for covering the light-emitting body 1.

Moreover, the LED package structure is electrically disposed on a PCB (Printed Circuit Board). The positive conductive layer P and the negative conductive N are electrically connected to the PCB via two wires w. One part of light beam generated from the light-emitting body 1 is directed upward, and another part of the light beams L generated from the light-generating body 1 is projected downwards and is reflected by the reflecting layer 2 in order to generate upward projecting light.

However, the LED package structure of the prior art has the following defects:

1. Only one part of the positive conductive layer P and the negative conductive layer N is exposed, so that the LED package structure cannot provide larger conductive area for generate more lighting power and cannot provide lager heat-dissipating area for obtaining good heat-dissipating efficiency.

2. Because the light-emitting body 1 is covered by the transparent package body 3, heat generated by the light-emitting body 1 cannot be dissipated quickly due to the resistance of the transparent package body 3. Hence, the heat-dissipating efficiency of the LED package structure is bad.

3. The reflecting layer 2, the transparent package body 3 and the two wires w are necessary structures in the LED package structure of the prior art. Hence, the manufacturing cost and manufacturing time of the prior art are increased.

SUMMARY OF THE INVENTION

One particular aspect of the present invention is to provide a wafer level LED package structure for increasing conductive area and heat-dissipating area and a method for making the same. The present invention provides a large-sized second positive conductive layer and a large-sized second negative conductive layer, so that the present invention can provide more lighting power due to the large-sized second positive conductive layer and provide good heat-dissipating efficiency due to the large-sized second negative conductive layer.

In order to achieve the above-mentioned aspects, the present invention provides a wafer level LED package structure for increasing conductive area and heat-dissipating area, including: a light-emitting unit, a first conductive unit, a second conductive unit and an insulative unit. The light-emitting unit has a light-emitting body, a positive conductive layer and a negative conductive layer formed on the light-emitting body, a first insulative layer formed between the positive conductive layer and the negative conductive layer, and a light-emitting area formed in the light-emitting body. The first conductive unit has a first positive conductive layer formed on the positive conductive layer and a first negative conductive layer formed on the negative conductive layer. The second conductive unit has a second positive conductive layer formed on the first positive conductive layer and a second negative conductive layer formed on the first negative conductive layer. The insulative unit has a second insulative layer formed on the first insulative layer and disposed between the second positive conductive layer and the second negative conductive layer.

Moreover, the wafer level LED package structure further includes a phosphor layer formed on a bottom side of the light-emitting unit or on a bottom side and a peripheral side of the light-emitting unit.

In order to achieve the above-mentioned aspects, the present invention provides a method for making a wafer level LED package structure for increasing conductive area and heat-dissipating area, including: providing a wafer having a plurality of light-emitting units, and each light-emitting unit having a light-emitting body, a positive conductive layer and a negative conductive layer formed on the light-emitting body, a first insulative layer formed between the positive conductive layer and the negative conductive layer, and a light-emitting area formed in the light-emitting body; respectively forming a plurality of first conductive units on the light-emitting units, and each first conductive unit having a first positive conductive layer formed on the corresponding positive conductive layer and a first negative conductive layer formed on the corresponding negative conductive layer; respectively forming a plurality of second insulative layers on the first insulative layers; and respectively forming a plurality of second conductive units on the first conductive units, each second conductive unit having a second positive conductive layer formed on the corresponding first positive conductive layer and a second negative conductive layer formed on the corresponding first negative conductive layer, and each second insulative layer being disposed between each second positive conductive layer and each second negative conductive layer.

Furthermore, after the step of respectively forming a plurality of second conductive units on the first conductive units, the method further includes the following two different aspects:

The first aspect is: overturning the wafer and placing the wafer on a heatproof polymer substrate; forming a phosphor layer on a bottom side of each light-emitting unit; and cutting the wafer in order to form a plurality of LED package structure.

The second aspect is: overturning the wafer and placing the wafer on a heatproof polymer substrate; firstly cutting the wafer to form a plurality of grooves between the light-emitting units; filling phosphor materials into the grooves; solidifying the phosphor materials to form a phosphor layer on a bottom side and a peripheral side of each light-emitting unit; and secondly cutting the wafer in order to form a plurality of LED package structure.

Hence, the present invention has the following advantages:

1. With regards to the first embodiment, because the second conductive unit has a second positive conductive layer formed on the corresponding first positive conductive layer and a second negative conductive layer formed on the corresponding first negative conductive layer, and each second insulative layer is disposed between each second positive conductive layer and each second negative conductive layer, so that the second positive conductive layer and the second negative conductive layer can provide larger conductive area and lager heat-dissipating area. Hence, the present invention can provide more lighting power due to the larger conductive area and provide good heat-dissipating efficiency due to the lager heat-dissipating area.

2. With regards to the first embodiment, the phosphor layer formed on the bottom side of the $Al_2O_3$ substrate mates with the light beams generated from light-emitting area in order to provide white light. With regards to the second embodiment, the phosphor layer is formed on the bottom side and the peripheral side of the light-emitting unit in order to mate with the light beams generated from light-emitting area for providing white light.

3. The present invention does not need to use reflecting layer, the transparent package body and the wires as shown in prior art. Hence, the manufacturing cost and manufacturing time of the present invention are decreased.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 2-1 and 2-2 are a flowchart of a method for making a wafer level LED package structure for increasing conductive area and heat-dissipating area according to the first embodiment of the present invention;

FIGS. 2A to 2K are lateral, schematic views of a wafer level LED package structure for increasing conductive area and heat-dissipating area according to the first embodiment of the present invention, at different stages of the packaging processes, respectively;

FIGS. 3A to 3C are lateral, schematic views of a wafer level LED package structure for increasing conductive area and heat-dissipating area according to the second embodiment of the present invention, at different stages of the partial packaging processes, respectively.

DETAILED DESCRIPTION OF PREFERRED EMBODIMENTS

Figure 1:
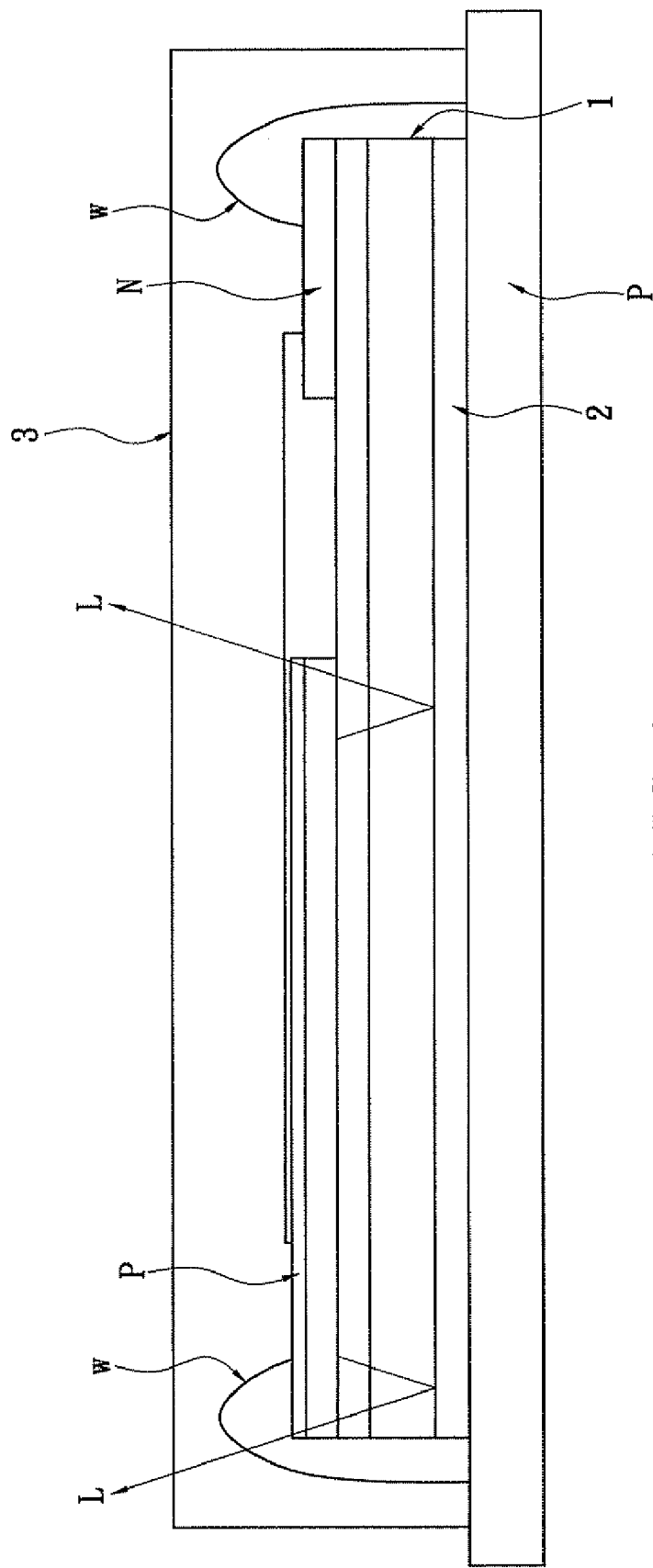
FIG. 1 is a lateral, schematic view of an LED package structure of the prior art.
Figures 1, 2:
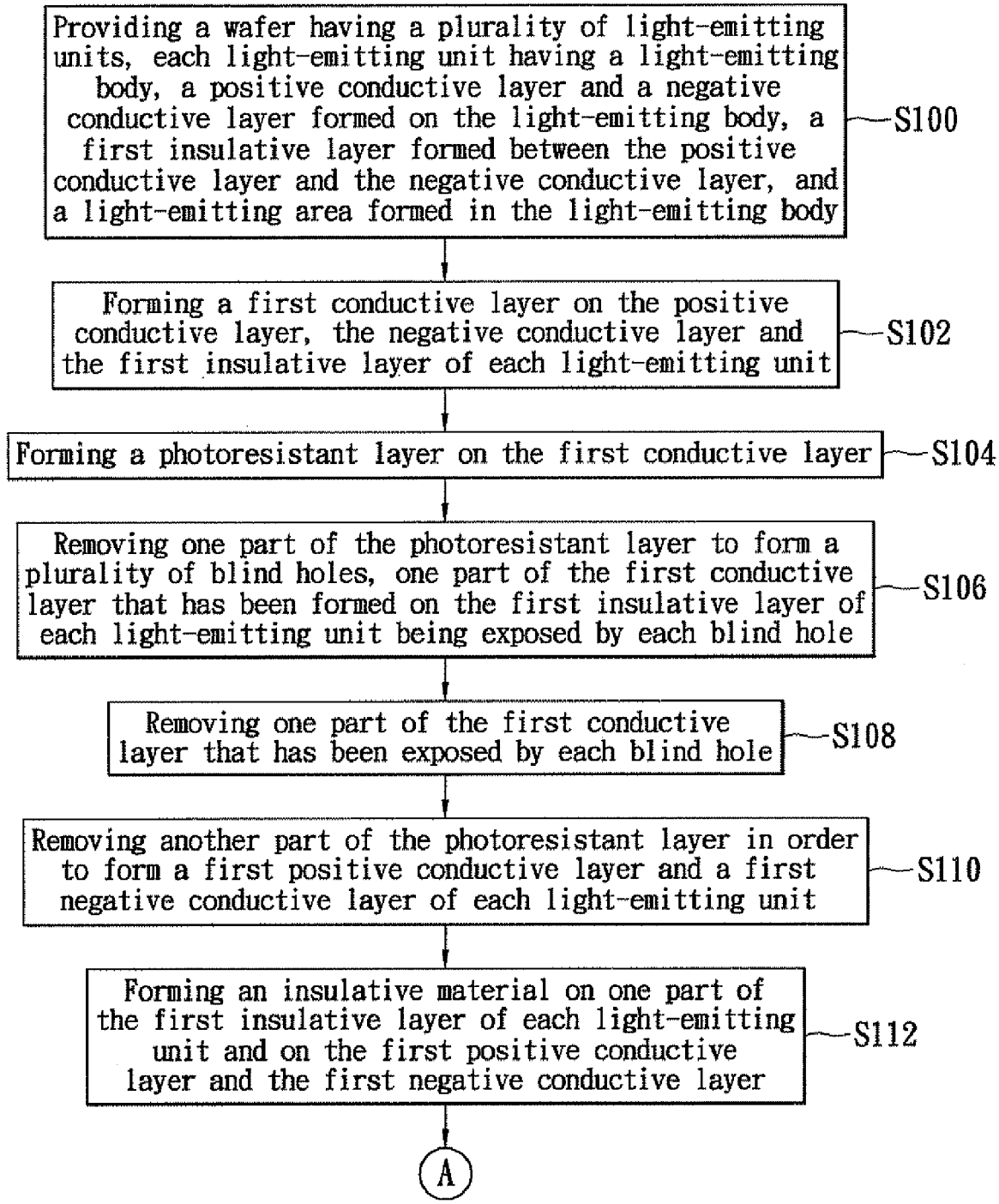
Figure 2:
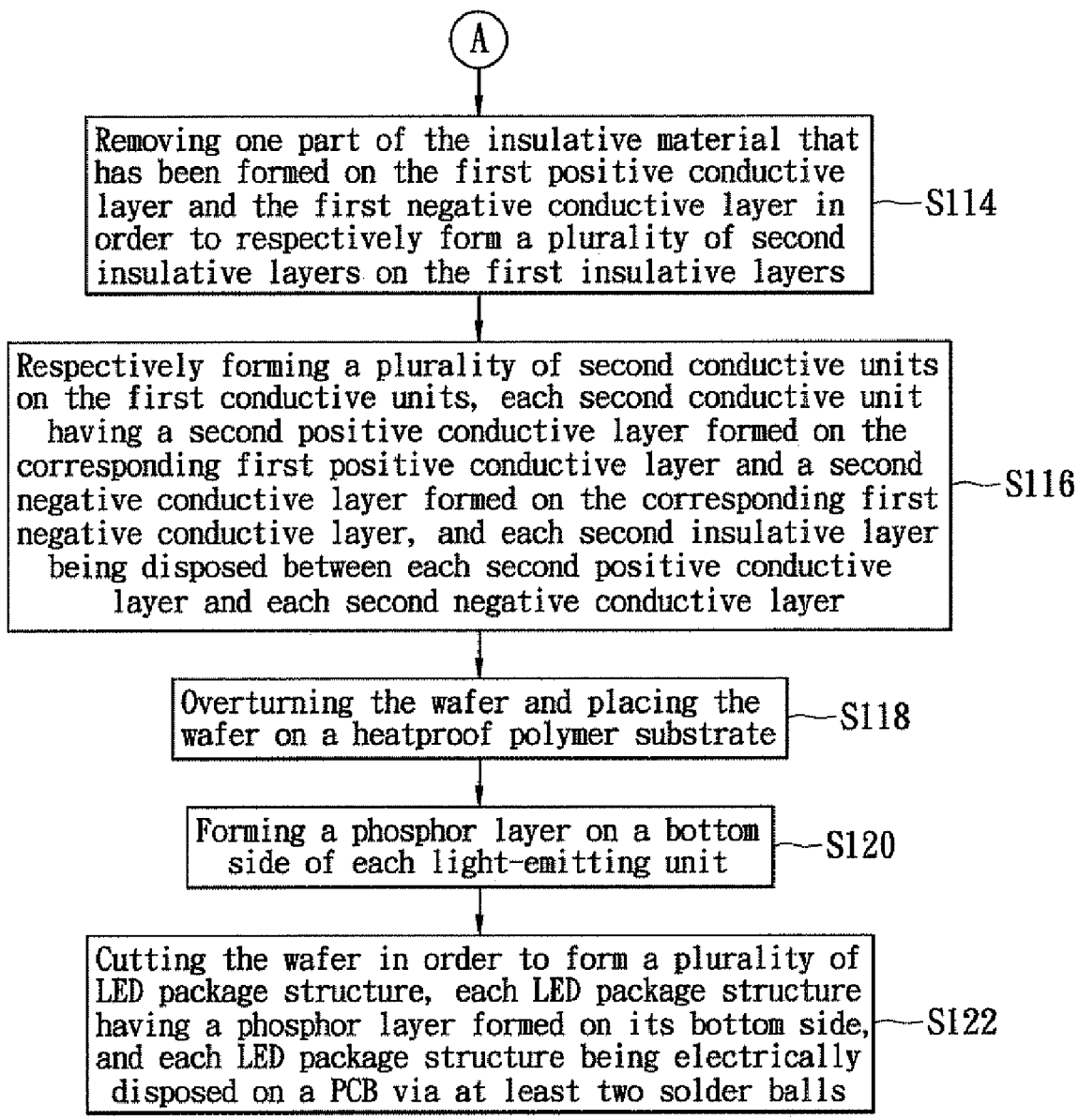

Referring to FIGS. 2-1, 2-2 and 2A to 2K, the first embodiment of the present invention provides a method for making a wafer level LED package structure for increasing conductive area and heat-dissipating area. The method includes following steps:

The step S100 is: referring to FIGS. 2-1, 2-2 and 2A, providing a wafer W having a plurality of light-emitting units 1a (only shown one light-emitting units 1a in Figures), each light-emitting unit 1a having a light-emitting body 10a, a positive conductive layer Pa (P-type semiconductor material layer) and a negative conductive layer Na (N-type semiconductor material layer) formed on the light-emitting body 10a, a first insulative layer 11a formed between the positive conductive layer Pa and the negative conductive layer Na, and a light-emitting area Aa formed in the light-emitting body 10a. In addition, the first insulative layers 11a can be polymer layers or ceramic layers.

Moreover, the light-emitting body 10a has an $Al_2O_3$ substrate 100a, a negative GaN conductive layer 101a formed on the $Al_2O_3$ substrate 100a, and a positive GaN conductive layer 102a formed on the negative GaN conductive layer 101a. The positive conductive layer Pa is formed on the positive GaN conductive layer 102a, the negative conductive layer Na is formed on the negative GaN conductive layer 101a, and the first insulative layer 11a is formed on the negative GaN conductive layer 101a and disposed between the positive conductive layer Pa, the negative conductive layer Na and the positive GaN conductive layer 102a. In addition, the positive conductive layer Pa has a positive conductive area P1a formed on its top surface, the negative conductive layer Na has a negative conductive area N1a formed on its top surface, and one part of the positive conductive area P1a and one part of the negative conductive area N1a are covered by the first insulative layer 11a.

The step S102 is: referring to FIGS. 2-1, 2-2 and 2B, forming a first conductive layer Ma on the positive conductive layer Pa, the negative conductive layer Na and the first insulative layer 11a of each light-emitting unit 1a. In addition, the first conductive layer Ma is a conductive metal layer that is formed by electroless plating such as chemical evaporation, physical evaporation or sputtering.

Figure 2C:
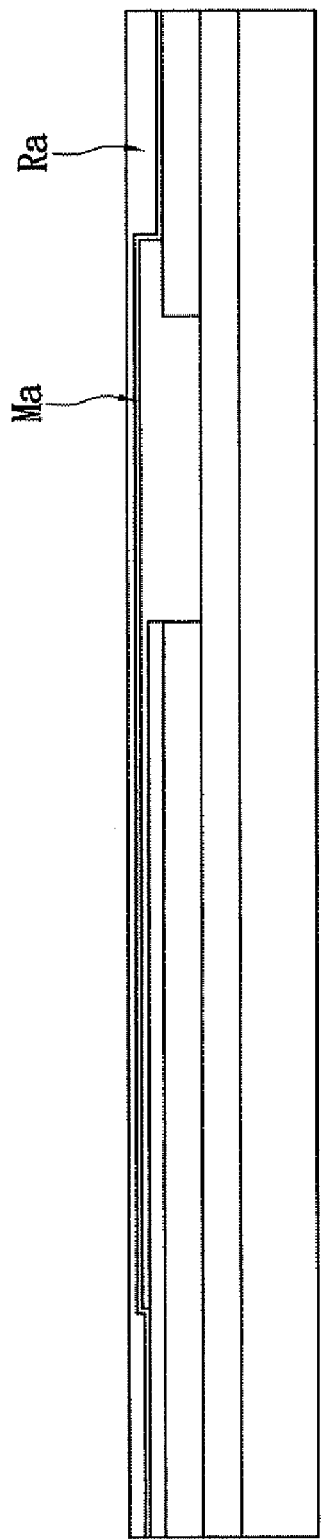

The step S104 is: referring to FIGS. 2-1, 2-2 and 2C, forming a photoresistant layer Ra on the first conductive layer Ma.

Figure 2D:
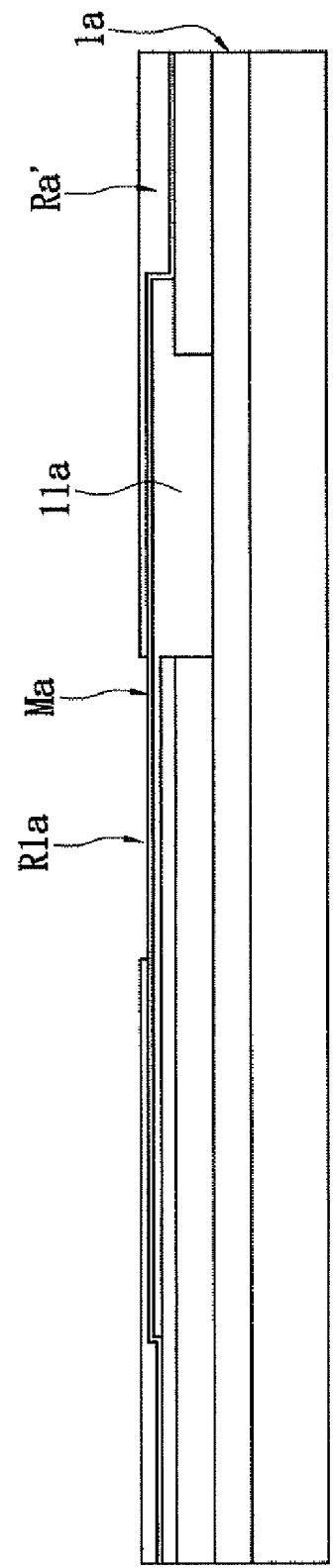

The step S106 is: referring to FIGS. 2-1, 2-2 and 2D, removing one part of the photoresistant layer Ra to form a plurality of blind holes R1a, one part of the first conductive layer Ma that has been formed on the first insulative layer 11a of each light-emitting unit 1a being exposed by each blind hole R1a. In addition, one part of the photoresistant layer Ra is removed by matching exposure and development to form a removed photoresistant layer Ra'.

Figure 2E:
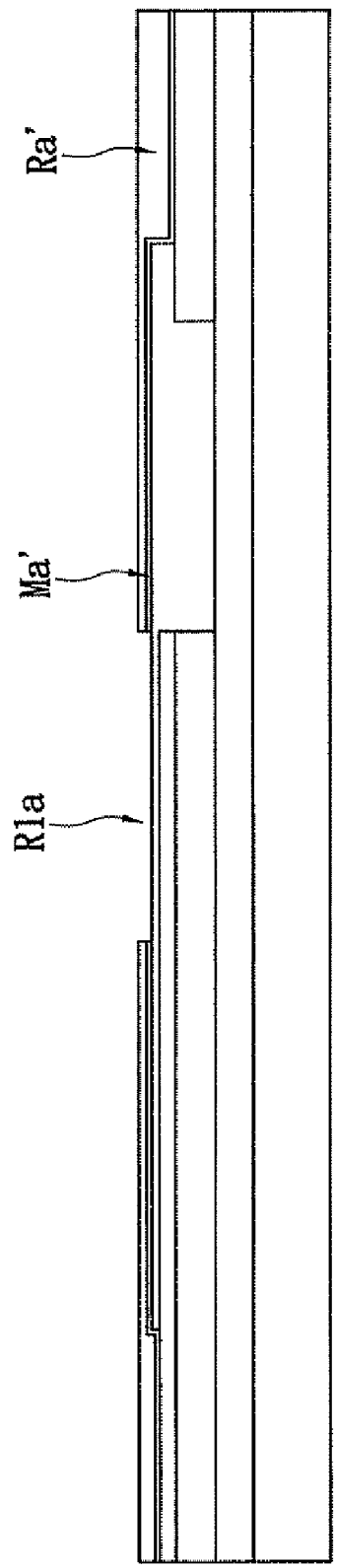

The step S108 is: referring to FIGS. 2-1, 2-2 and 2E, removing one part of the first conductive layer Ma that has been exposed by each blind hole R1a. In addition, one part of the first conductive layer Ma that has been exposed by each blind hole R1a is removed by etching to form a removed first conductive layer Ma'.

Figure 2F:
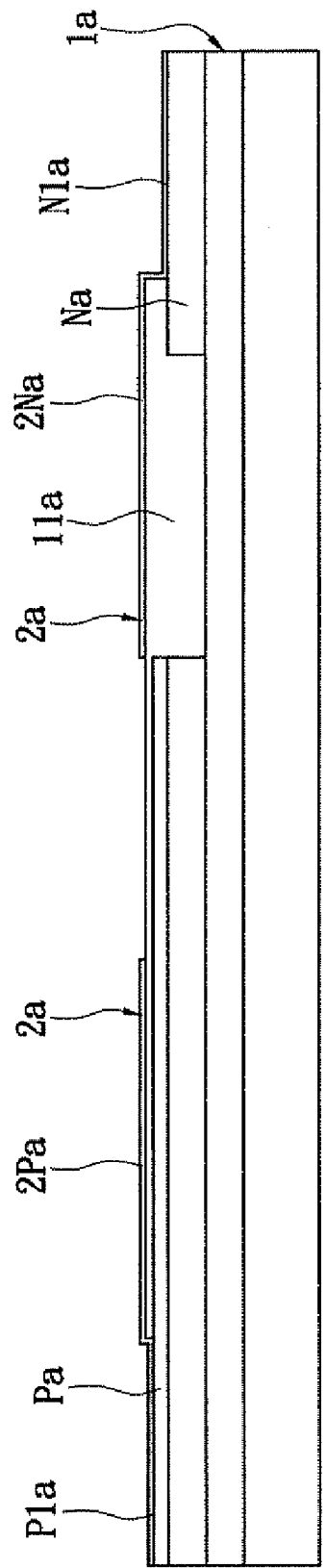

The step S110 is: referring to FIGS. 2-1, 2-2 and 2F, removing another part of the photoresistant layer Ra' in order to form a first positive conductive layer 2Pa and a first negative conductive layer 2Na of each light-emitting unit 1a. In addition, the first positive conductive layer 2Pa and the first negative conductive layer 2Na can be made of TiW alloy or NiV alloy etc.

In other words, after the step of S100, the steps from S102 to S110 disclose "respectively forming a plurality of first conductive units 2a on the light-emitting units 1a. Each first conductive unit 2a (the first conductive layer Ma') has a first positive conductive layer 2Pa formed on the corresponding positive conductive layer Pa and a first negative conductive layer 2Na formed on the corresponding negative conductive layer Na. In addition, the first positive conductive layer 2Pa and the first negative conductive layer 2Na are insulated from each other. The first positive conductive layer 2Pa is formed on another part of the positive conductive area P1a and on one part of the first insulative layer 11a, and the first negative conductive layer 2Na is formed on another part of the negative conductive area N1a and on one part of the first insulative layer 11a.

The step S112 is: referring to FIGS. 2-1, 2-2 and 2G, forming an insulative material Sa on one part of the first insulative layer 11a of each light-emitting unit 1a and on the first positive conductive layer 2Pa and the first negative conductive layer 2Na.

The step S114 is: referring to FIGS. 2-1, 2-2 and 2H, removing one part of the insulative material Sa that has been formed on the first positive conductive layer 2Pa and the first negative conductive layer 2Na in order to respectively form a plurality of second insulative layers 3a on the first insulative layers 11a. In addition, the second insulative layers 3a can be polymer layers or ceramic layers.

Figure 2I:
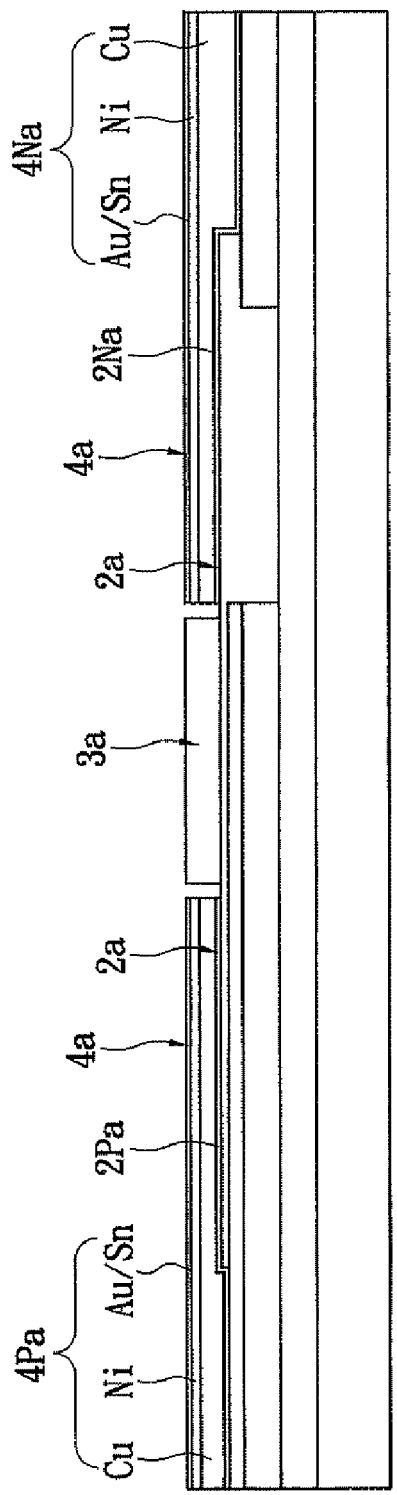

The step S116 is: referring to FIGS. 2-1, 2-2 and 2I, respectively forming a plurality of second conductive units 4a on the first conductive units 2a, each second conductive unit 4a having a second positive conductive layer 4Pa formed on the corresponding first positive conductive layer 2Pa and a second negative conductive layer 4Na formed on the corresponding first negative conductive layer 2Na, and each second insulative layer 3a being disposed between each second positive conductive layer 4Pa and each second negative conductive layer 4Na. Each second insulative layer 3a is separated from each second positive conductive layer 4Pa and each second negative conductive layer 4Na by a predetermined distance. In the present invention, the second positive conductive layer 4Pa is composed of at least three conductive layers applied upon each other by electroplating, and the second negative conductive layer 4Na is composed of at least three conductive layers applied upon each other by electroplating. The conductive layers are a Copper (Cu) layer, a Nickel (Ni) layer and a Gold/Tin (Au/Sn) layer, whereby the Nickel layer is formed on the copper layer, and the Gold/Tin layer is formed on the Nickel layer.

According to different requirements, the second positive conductive layer 4Pa is composed of at least two conductive layers applied upon each other by electroplating, and the second negative conductive layer 4Na is composed of at least two conductive layers applied upon each other by electroplating. The conductive layers are a Nickel (Ni) layer and a Gold/Tin (Au/Sn) layer, whereby the Gold/Tin layer is formed on the Nickel layer In other words, the second positive conductive layer 4Pa composed of more than two conductive layers applied upon each other and the second negative conductive layer 4Na composed of more than two conductive layers applied upon each other are protected in the present invention.

Figure 2J:
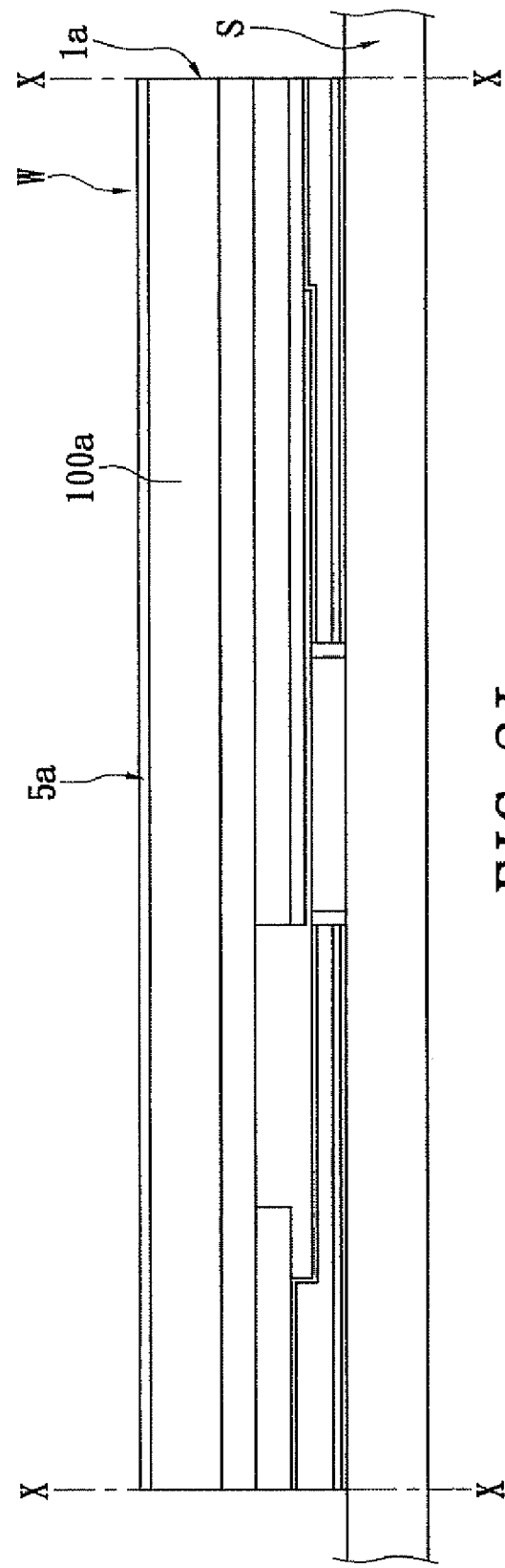

The step S118 is: referring to FIGS. 2-1, 2-2 and 2J, overturning the wafer W and placing the wafer W on a heatproof polymer substrate S.

The step S120 is: referring to FIGS. 2-1, 2-2 and 2J, forming a phosphor layer 5a on a bottom side of each light-emitting unit 1a. In other words, the wafer W is overturned and the phosphor layer 5a is formed on the bottom side of the $Al_2O_3$ substrate 100a. In addition, the phosphor layer 5a is fluorescent resin that can be formed by mixing silicone and fluorescent powder or mixing epoxy and fluorescent powder.

Figure 2K:
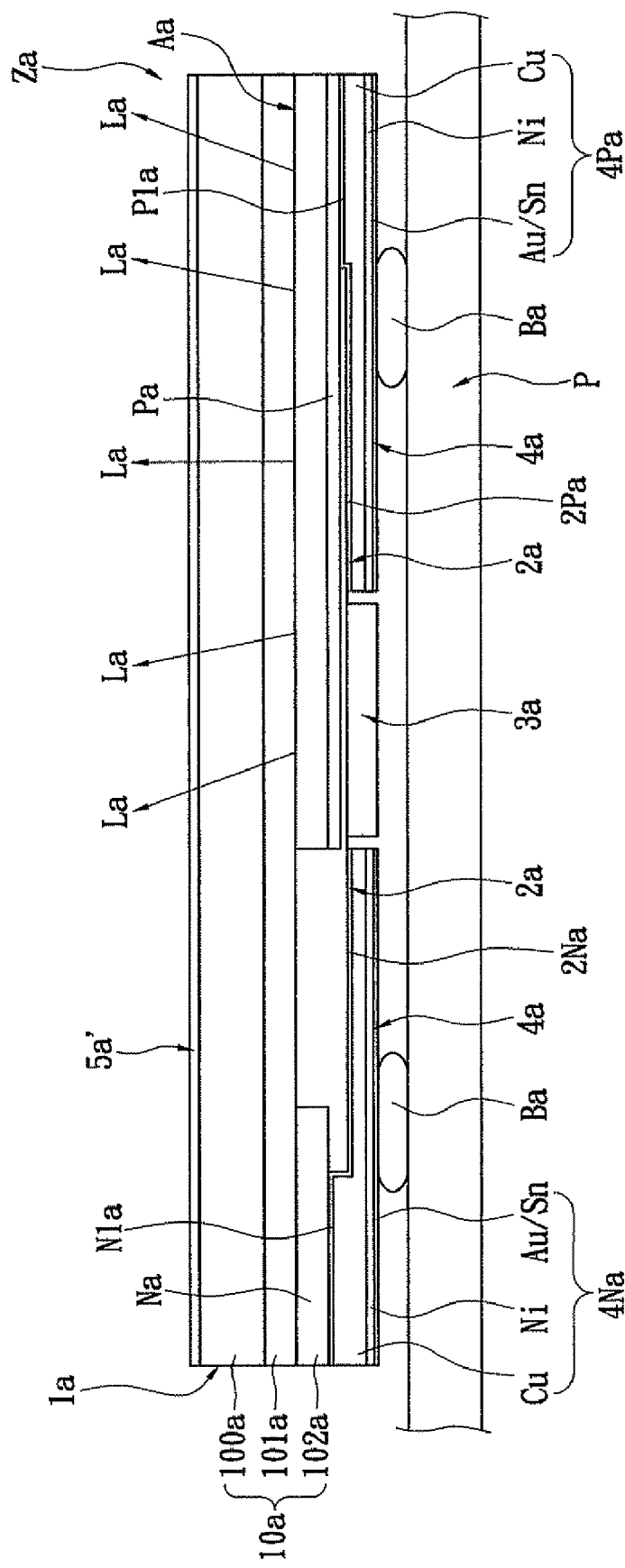

The step S122 is: referring to FIGS. 2-1, 2-2 and 2K, cutting the wafer W along a line X-X of FIG. 2J in order to form a plurality of LED package structure Za. Each LED package structure Za has a phosphor layer 5a' formed on its bottom side. In addition, each LED package structure Za is electrically disposed on a PCB (Printed Circuit Board) P via at least two solder balls Ba. Light beams La generated from the light-generating area Aa of each LED package structure Za pass through the phosphor layer 5a' in order to provide illumination. Furthermore, one part of the light beams generated from the light-generating area Aa is projected downwards and is reflected by the positive conductive layer Pa and the negative conductive layer Na in order to generate upward projecting light.

Therefore, referring to FIG. 2K, the first embodiment of the present invention provides a wafer level LED package structure for increasing conductive area and heat-dissipating area, including: a light-emitting unit 1a, a first conductive unit 2a, a second conductive unit 4a, an insulative unit (a second insulative layer 3a), and a phosphor layer 5a'.

The light-emitting unit 1a has a light-emitting body 10a, a positive conductive layer Pa and a negative conductive layer Na formed on the light-emitting body 10a, a first insulative layer 11a formed between the positive conductive layer Pa and the negative conductive layer Na, and a light-emitting area Aa formed in the light-emitting body 10a. In addition, the light-emitting body 10a has an $Al_2O_3$ substrate 100a, a negative GaN conductive layer 101a formed on the $Al_2O_3$ substrate 100a, and a positive GaN conductive layer 102a formed on the negative GaN conductive layer 101a. The positive conductive layer Pa is formed on the positive GaN conductive layer 102a, the negative conductive layer Na is formed on the negative GaN conductive layer 101a, and the first insulative layer 11a is formed on the negative GaN conductive layer 101a and disposed between the positive conductive layer Pa, the negative conductive layer Na and the positive GaN conductive layer 102a. In addition, the positive conductive layer Pa has a positive conductive area P1a formed on its top surface, the negative conductive layer Na has a negative conductive area N1a formed on its top surface, and one part of the positive conductive area P1a and one part of the negative conductive area N1a are covered by the first insulative layer 11a.

Moreover, the first conductive unit 2a has a first positive conductive layer 2Pa formed on the positive conductive layer Pa and a first negative conductive layer 2Na formed on the negative conductive layer Na. In addition, the first positive conductive layer 2Pa and the first negative conductive layer 2Na are insulated from each other. The first positive conductive layer 2Pa is formed on another part of the positive conductive area P1a and on one part of the first insulative layer 11a, and the first negative conductive layer 2Na is formed on another part of the negative conductive area N1a and on one part of the first insulative layer 11a.

Furthermore, the second conductive unit 4a has a second positive conductive layer 4Pa formed on the first positive conductive layer 2Pa and a second negative conductive layer 4Na formed on the first negative conductive layer 2Na. Each second insulative layer 3a is disposed between each second positive conductive layer 4Pa and each second negative conductive layer 4Na. Each second insulative layer 3a is separated from each second positive conductive layer 4Pa and each second negative conductive layer 4Na by a predetermined distance. In the present invention, the second positive conductive layer 4Pa is composed of at least three conductive layers applied upon each other by electroplating, and the second negative conductive layer 4Na is composed of at least three conductive layers applied upon each other by electroplating. The conductive layers are a Copper (Cu) layer, a Nickel (Ni) layer and a Gold/Tin (Au/Sn) layer, whereby the Nickel layer is formed on the copper layer, and the Gold/Tin layer is formed on the Nickel layer In addition, the second insulative layer 3a is formed on the first insulative layer 11a and disposed between the second positive conductive layer 4Pa and the second negative conductive layer 4Na. Furthermore, the phosphor layer 5a' formed on the bottom side of the $Al_2O_3$ substrate 100a mates with the light beams La generated from light-emitting area Aa in order to provide white light.

Figure 2L:
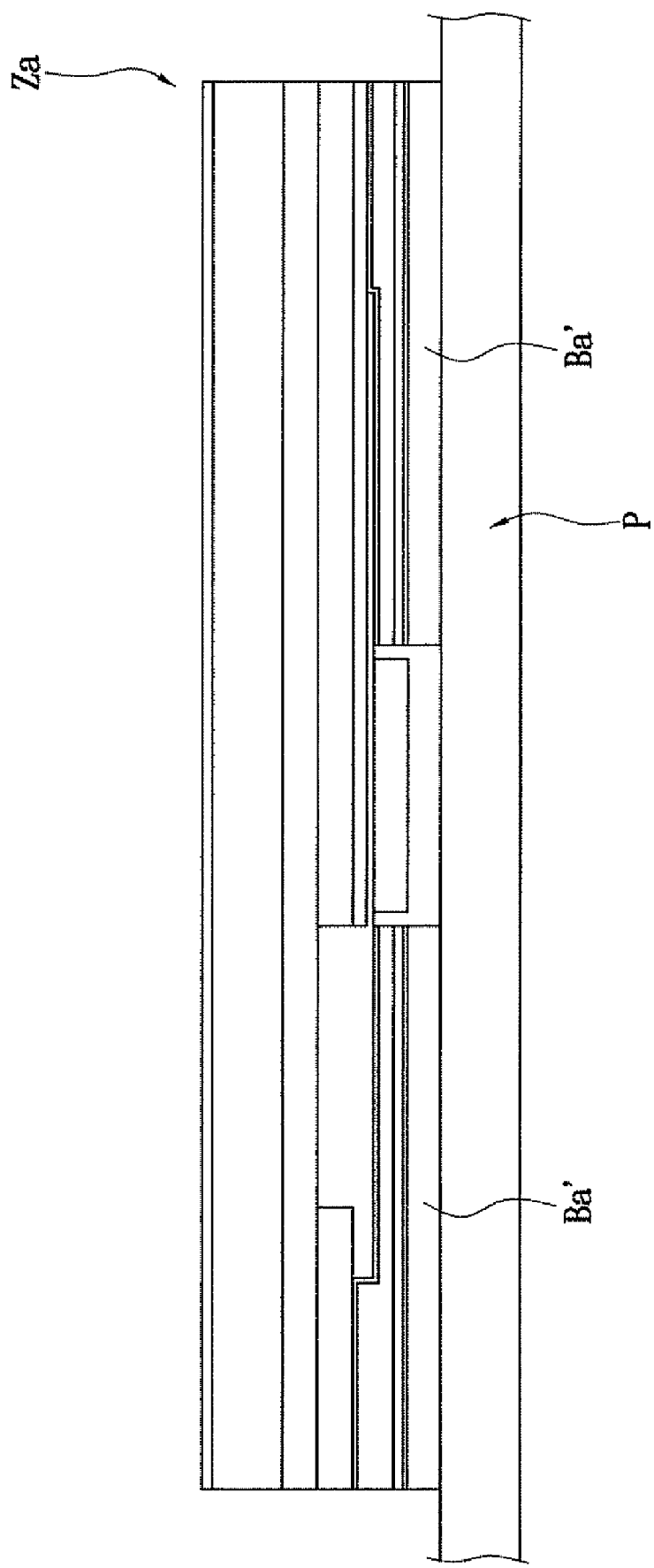
FIG. 2L is a lateral, schematic view of a wafer level LED package structure electrically disposed on a PCB via solder glue according to the first embodiment of the present invention.

Referring to FIG. 2L, each LED package structure Za is electrically disposed on a PCB (Printed Circuit Board) P via at least two layers of solder glue Ba'.

Figure 3:
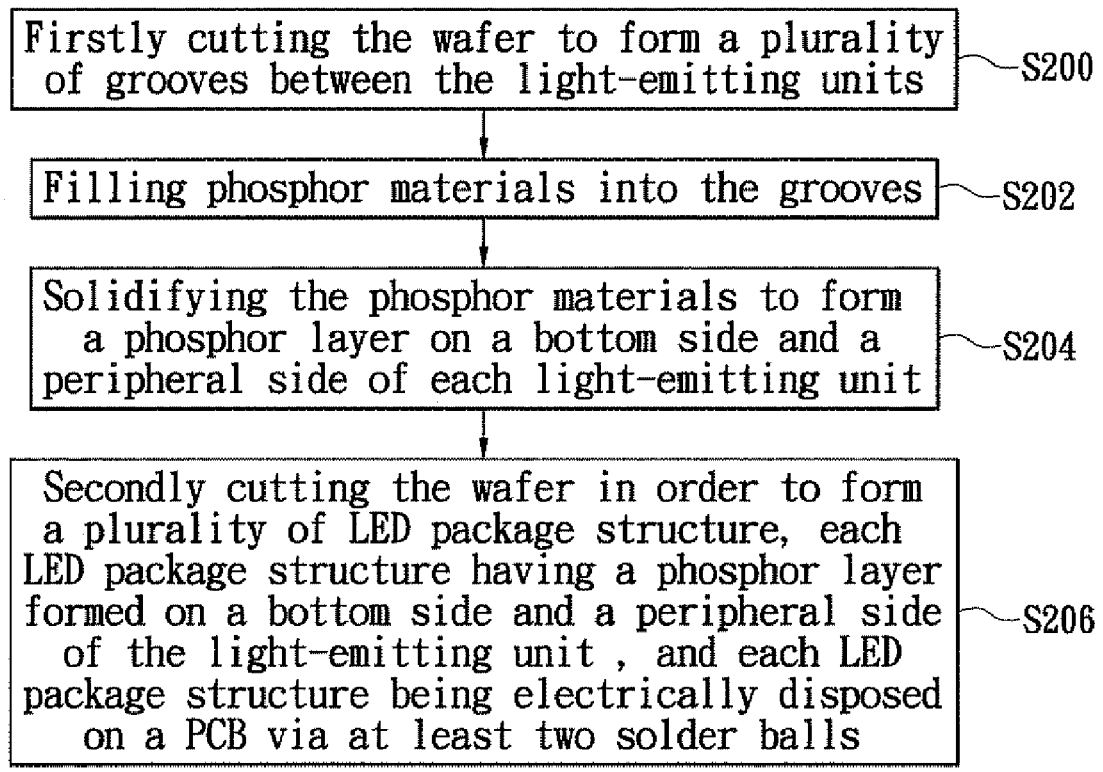
FIG. 3 is a partial flowchart of a method for making a wafer level LED package structure for increasing conductive area and heat-dissipating area according to the second embodiment of the present invention.

Referring to FIGS. 3 and 3A to 3C, the difference between the second embodiment and the first embodiment is that: after the step of overturning the wafer W and placing the wafer W on a heatproof polymer substrate S, the method of the second embodiment further includes following steps:

The step S200 is: referring to FIGS. 3 and 3A, firstly cutting the wafer W to form a plurality of grooves C between the light-emitting units 1b.

The step S202 is: referring to FIGS. 3 and 3B, filling phosphor materials (not shown) into the grooves C. In addition, the phosphor materials are fluorescent resin that can be formed by mixing silicone and fluorescent powder or mixing epoxy and fluorescent powder.

The step S204 is: referring to FIGS. 3 and 3B, solidifying the phosphor materials to form a phosphor layer 5b on a bottom side and a peripheral side of each light-emitting unit 1b.

Figure 3C:
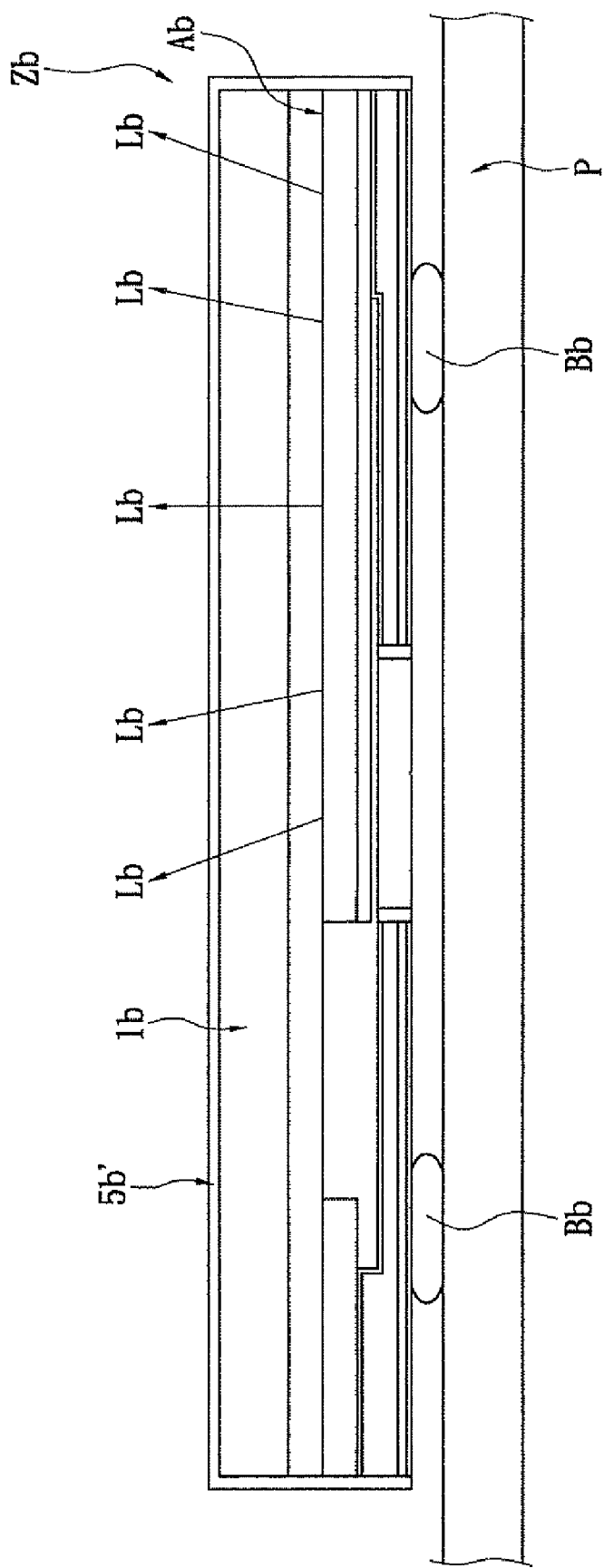

The step S206 is: referring to FIGS. 3 and 3C, secondly cutting the wafer W along a line Y-Y of FIG. 3B in order to form a plurality of LED package structure Zb. Each LED package structure Zb has a phosphor layer 5b' formed on a bottom side and a peripheral side of the light-emitting unit 1b or on a bottom side and a peripheral side of each LED package structure Zb. In addition, each LED package structure Zb is electrically disposed on a PCB (Printed Circuit Board) P via at least two solder balls Bb. Light beams Lb generated from the light-generating area Ab of each LED package structure Zb pass through the phosphor layer 5b' in order to provide illumination.

Therefore, referring to FIG. 3C, the difference between the second embodiment and the first embodiment is that: the phosphor layer 5b' is formed on the bottom side and the peripheral side of the light-emitting unit 1b or on the bottom side and the peripheral side of each LED package structure Zb in order to mate with the light beams Lb generated from light-emitting area Ab for providing white light.

Figure 3D:
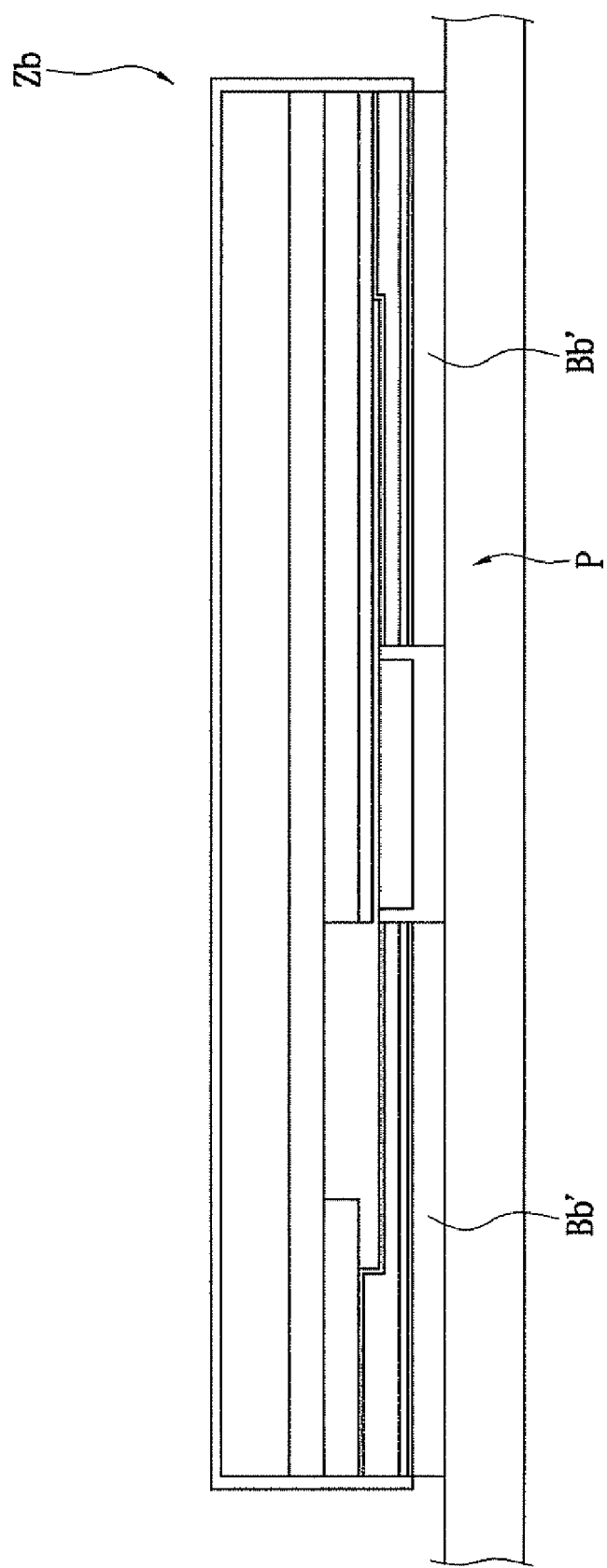
FIG. 3D is a lateral, schematic view of a wafer level LED package structure electrically disposed on a PCB via solder glue according to the second embodiment of the present invention.

Referring to FIG. 3D, each LED package structure Zb is electrically disposed on a PCB (Printed Circuit Board) P via at least two layers of solder glue Bb'.

In conclusion, the present invention has the following advantages:

1. With regards to the first embodiment, because the second conductive unit 4a has a second positive conductive layer 4Pa formed on the corresponding first positive conductive layer 2Pa and a second negative conductive layer 4Na formed on the corresponding first negative conductive layer 2Na, and each second insulative layer 3a is disposed between each second positive conductive layer 4Pa and each second negative conductive layer 4Na, so that the second positive conductive layer 4Pa and the second negative conductive layer 4Na can provide larger conductive area and lager heat-dissipating area. Hence, the present invention can provide more lighting power due to the larger conductive area and provide good heat-dissipating efficiency due to the lager heat-dissipating area.

2. With regards to the first embodiment, the phosphor layer 5a' formed on the bottom side of the $Al_2O_3$ substrate 100a mates with the light beams La generated from light-emitting area Aa in order to provide white light. With regards to the second embodiment, the phosphor layer 5b' is formed on the bottom side and the peripheral side of the light-emitting unit 1b in order to mate with the light beams Lb generated from light-emitting area Ab for providing white light.

3. The present invention does not need to use reflecting layer, the transparent package body and the wires as shown in prior art. Hence, the manufacturing cost and manufacturing time of the present invention are decreased.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A wafer level LED package structure, comprising:
a light-emitting unit including a light-emitting body having a positive conducting region and a negative conducting region formed on the light-emitting body, an insulative structure formed between and electrically separating the positive conducting region and the negative conducting region;
a first conductive unit comprising at least one first positive conductive layer formed on the positive conducting region and at least one first negative conductive layer formed on the negative conducting region of the light-emitting unit respectively;
a second conductive unit comprising at least one second positive conductive layer formed on the first positive conductive layer and a second negative conductive layer formed on the first negative conductive layer of the first conductive unit, the second positive conductive layer and the second negative conductive layer forming an exposed positive contact surface and an exposed negative contact surface respectively, wherein the area of the exposed positive contacted surface is substantially identical to the area of the exposed negative contact surface; and
an insulative unit having an insulating layer formed on the insulative structure of the light-emitting unit between the second positive conductive layer and the second negative conductive layer, wherein the second insulative layer is separated from the second positive conductive layer by a predetermined distance defining a first gap there-between, and wherein the second insulative layer is separated from the second negative conductive layer by a predetermined distance defining a second gap therebetween.

2. The wafer level LED package structure as claimed in claim 1, wherein the light-emitting body has an $Al_2O_3$ substrate, a negative GaN layer formed on the $Al_2O_3$ substrate, and a positive GaN layer formed on the negative GaN layer; the positive conductive layer is formed on the positive GaN layer, the negative conductive layer is formed on the negative GaN layer, and the first insulative layer is formed on the negative GaN layer and disposed between the positive conductive layer, the negative conductive layer and the positive GaN layer.

3. The wafer level LED package structure as claimed in claim 1, wherein the positive conductive layer has a positive conductive area formed on its top surface, the negative conductive layer has a negative conductive area formed on its top surface, and one part of the positive conductive area and one part of the negative conductive area are covered by the first insulative layer.

4. The wafer level LED package structure as claimed in claim 3, wherein the first positive conductive layer and the first negative conductive layer are insulated from each other, the first positive conductive layer is formed on another part of the positive conductive area and on one part of the first insulative layer, and the first negative conductive layer is formed on another part of the negative conductive area and on one part of the first insulative layer.

5. The wafer level LED package structure as claimed in claim 1, wherein the first insulative layer and the second insulative layer are polymer layers or ceramic layers.

6. The wafer level LED package structure as claimed in claim 1, wherein the second positive conductive layer is composed of at least two conductive layers applied upon each other by electroplating, the second negative conductive layer is composed of at least two conductive layers applied upon each other by electroplating, the conductive layers are a Nickel layer and a Gold/Tin layer, whereby the Gold/Tin layer is formed on the Nickel layer.

7. The wafer level LED package structure as claimed in claim 1, wherein the second positive conductive layer is composed of at least three conductive layers applied upon each other by electroplating, the second negative conductive layer is composed of at least three conductive layers applied upon each other by electroplating, the conductive layers are a Copper layer, a Nickel layer and a Gold/Tin layer, whereby the Nickel layer is formed on the copper layer, and the Gold/Tin layer is formed on the Nickel layer.

8. The wafer level LED package structure as claimed in claim 1, further comprising: a phosphor layer formed on a bottom side of the light-emitting unit or on a bottom side and a peripheral side of the light-emitting unit.

* * * * *